United States Patent [19]

Kikuchi

[11] Patent Number: 4,612,463
[45] Date of Patent: Sep. 16, 1986

[54] INTERFACE CIRCUIT

[75] Inventor: Kazuo Kikuchi, Miyagi, Japan

[73] Assignee: Alps Electric Co., Ltd., Japan

[21] Appl. No.: 590,686

[22] Filed: Mar. 19, 1984

[30] Foreign Application Priority Data

May 19, 1983 [JP] Japan .................... 58-73768[U]

[51] Int. Cl.⁴ ................. H03K 3/017; H03K 5/153
[52] U.S. Cl. ........................ 307/490; 307/356;
307/228; 307/475; 307/261; 328/147; 328/150
[58] Field of Search ............... 307/350, 354, 356, 359,
307/228, 475, 490, 261; 328/150, 147

[56] References Cited

U.S. PATENT DOCUMENTS 4,379,240  4/1983  Mammano ................... 307/356

Primary Examiner—John Zazworsky
Attorney, Agent, or Firm—Guy W. Shoup

[57] ABSTRACT

An interface circuit for connecting a tablet to an analog input unit of a computer, comprises a sawtooth generator operable in synchronism with a preset timing of the computer for generating a sawtooth voltage, and a comparator for comparing the sawtooth voltage with an output voltage from the tablet. The output voltage from the tablet can be converted into an output voltage having a corresponding time duration, which is supplied to the analog input unit.

3 Claims, 4 Drawing Figures

INTERFACE CIRCUIT

BACKGROUND OF THE INVENTION

The present invention relates to an interface circuit suitable for use in connecting a tablet input device (hereinafter referred to as a "tablet") to a microcomputer such as a personal computer or a television gate device.

Most of conventional personal computers and television gate devices have a microcomputer analog input unit to which a multidirectionally operable variable resistor can be connected. The multidirectionally operable variable resistor has a lever movable in X and Y directions to perform various operation on the computer, such as a game.

FIG. 1 of the accompanying drawings is illustrative of such a multidirectionally operable variable resistor connected to an analog input unit of a microcomputer. A multidirectionally operable variable resistor 1 is connected to a power supply outlet terminal 3 and an input terminal 4 of an analog input unit 2 of a microcomputer. The analog input unit 2 comprises a capacitor 5, an on-off switch 6, an input terminal 7, a comparator 8, and an output terminal 9. The on-off switch 6 can be periodically closed to discharge the capacitor 5 intermittently. The comparator 8 serves to compare a voltage $E_1$ across the capacitor 5 with a reference voltage $E_{S1}$ supplied from the input terminal 7 and to issue a voltage $E_0$ having alternate higher and lower levels. The variable resistor 1 has one terminal coupled to the power supply outlet terminal 3 and the other terminal to the input terminal 4.

Normally, the voltage supplied to the power supply outlet terminal 3 is 5 (V), and the reference voltage $E_{S1}$ applied from the input terminal 7 is 2 (V).

FIG. 2 is a diagram showing the waveforms of voltages in the circuit arrangement of FIG. 1. Identical reference characters denote identical voltages in FIGS. 1 and 2.

With the voltages specified as above, operation of the circuit arrangement of FIG. 1 will be described with reference to FIG. 2.

When the multidirectionally operable variable resistor 1 is connected between the power supply outlet terminal 3 and the input terminal 4, the variable resistor 1 and the capacitor 5 jointly form a time-constant circuit. The on-off switch 6 is alternately turned on and off by a switching signal S of a fixed period, that is, the on-off switch 6 is closed for a time interval t in each period to discharge the capacitor 5.

The voltage $E_1$ across the capacitor 5 falls to zero (V) during the time interval t in which the on-off switch 6 remains closed. At the same time that the on-off switch 6 is opened, the voltage $E_1$ rises at a rate according to a time constant determined by the resistance R of the variable resistor 1 and the static capacitance C of the capacitor 5. The voltage $E_1$ becomes $5 \times (1-e^{-CR})$ (V) which would reach 5 (V). When the on-off switch 6 is closed at a next time, the capacitor 5 is discharged through the on-off switch 6 to cause the voltage $E_1$ to fall to zero (V).

The voltage $E_1$ as it cyclically varies between zero (V) and 5 (V) is applied to the positive terminal of the comparator 8 in which the voltage $E_1$ is compared with the reference voltage $E_{S1}$ of 2 (V) which has been supplied from the input terminal 7 to the negative terminal of the comparator 8. The comparator 8 issues an output voltage $E_0$ of high level when $E_1 \geq E_{S1}$ and an output voltage $E_0$ of low level when $E_1 < E_{S1}$. The output voltage $E_0$ is supplied via the output terminal 9 to an analog-to-digital converter (not shown) from which a digital signal is delivered as data for the microcomputer.

The resistance R of the variable resistor 1 can be varied by manipulating a lever (not shown) attached to the variable resistor 1. The gradient of a rate of increase of the voltage $E_1$ varies when the resistance R is changed. More specifically, the gradient of rise of the voltage $E_1$ becomes smaller as the resistance R gets larger, and becomes steeper as the resistance R gets smaller. Therefore, the period in which the output voltage $E_0$ from the comparator 8 remains lower in level varies with the resistance R. This period includes an interval in which the on-off switch 6 is closed, and a period of time T from which such an interval is precluded is representative of the resistance R of the multidirectionally operable variable resistor 1.

For this reason, the data indicative of the resistance R can be supplied to the microcomputer, and various operations such as a game can be performed by manipulating the lever of the multidirectionally operable variable resistor 1.

The lever of the multidirectionally operable variable resistor 1 is however actuatable only for changing the position of a predetermined image displayed on a display unit. The variable resistor 1 fails to provide a capability such as for studying equipment, that is, to enter pattern data of desired images and characters into a microcomputer and display the pattern data on the display.

One known expedient for achieving such a capability comprises a thin-film switch known as a tablet composed of a flat resistor layer and a conductive layer. The tablet is connected to the microcomputer, and the data of a pattern described by a stylus on the tablet surface is entered into the microcomputer. The tablet has been employed as a data input device for a microcomputer in industrial machines such as designing machines.

Since the output voltage from the tablet used in the industrial machines is an analog voltage, there is connected an interface circuit between the tablet and the microcomputer for converting the analog voltage into a digital voltage.

With the tablet connected to a personal computer or a television game device, any desired pattern data of images and characters can be entered into the microcomputer through the tablet and displayed on the display unit. However, interface circuits which have been heretofore available is highly expensive, and personal computers and television game devices have had no terminal for digital data entry, or for connection to the interface circuit.

Instead, the personal computers and television game devices presently available have analog input units for connection to the multidirectionally operable variable resistor. Since the tablet produces an analog output voltage, it would be possible to connect the tablet directly to the analog input unit.

In FIG. 1, the resistance R of the multidirectionally operable variable resistor 1 can vary widely in the range of from zero (Ω) to 200 (kΩ) or 400 (kΩ), and the static capacitance C of the capacitor 5 is selected such that the gradient of rise of the voltage $E_1$ can sufficiently be discriminated over that range. However, the resistance of the tablet varies in the range of from zero (Ω) to 300

($\Omega$) or 500 ($\Omega$) which is much smaller than the resistance range of the variable resistor 1. Accordingly, any variation in the tablet resistance would cause a slight change in the gradient of rise of the voltage $E_1$, thus failing to provide a sufficient resolution.

As described above, the personal computers and television game devices have heretofore required expensive interface circuits in order to connect a tablet. The tablet would fail to function sufficiently as desired if it were connected to the microcomputer without an interface circuit.

SUMMARY OF THE INVENTION

It is an object of the present invention to provide an inexpensive interface circuit which enables a tablet to be connected to an analog input unit of a microcomputer for entering the data indicative accurately of the resistance of the tablet into the microcomputer.

To achieve the above object, an output voltage from a tablet, which is indicative of the resistance thereof, is compared with a sawtooth voltage synchronous with the operation of an analog input unit of a microcomputer to generate a binary signal having a time duration variable with the tablet resistance, the binary signal being supplied to the analog input unit.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
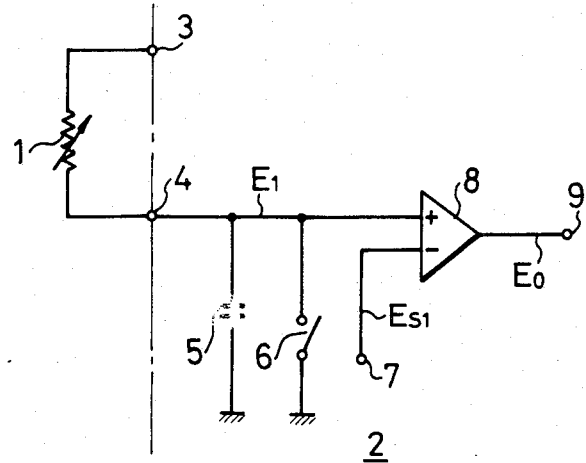
FIG. 1 is a circuit diagram showing a conventional circuit arrangement in which a multidirectionally operable variable resistor is connected to an analog input unit of a microcomputer.
Figure 2:
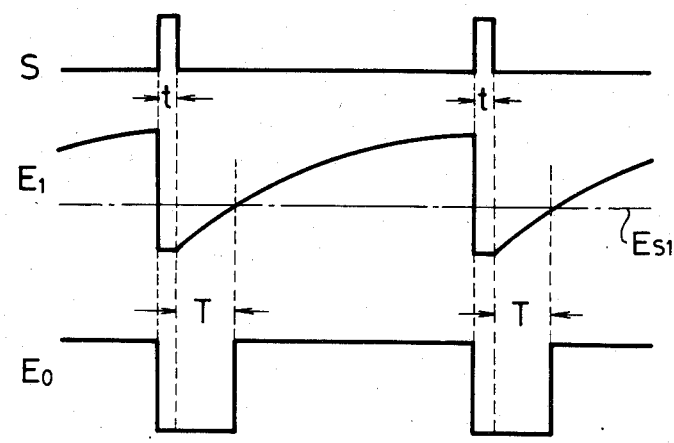
FIG. 2 is a diagram of the waveforms of voltages in the circuit arrangement shown in FIG. 1.
Figure 3:
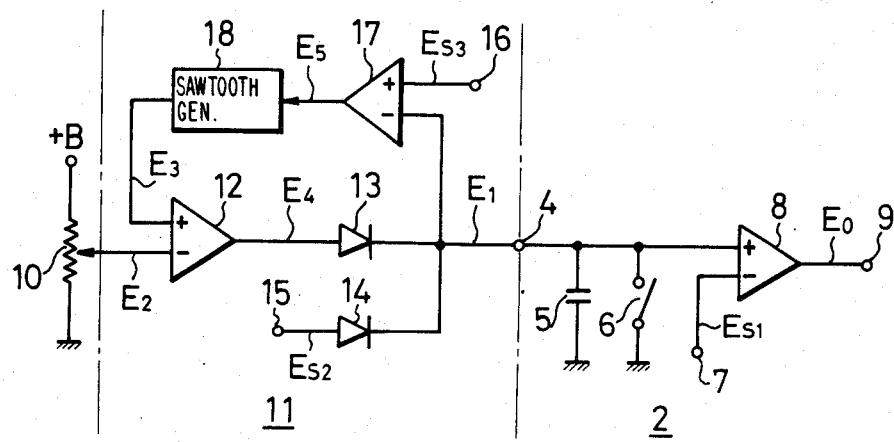
FIG. 3 is a block diagram of an interface circuit according to the present invention.

As shown in FIG. 3, a tablet 10 is connected to an interface circuit 11 composed of a comparator 12, a pair of parallel diodes 13, 14, input terminals 15, 16, a comparator 17, and a sawtooth generator 18. The interface circuit 11 is connected between the tablet 10 and an input terminal 4 of an analog input unit 2 of a microcomputer. Like or corresponding parts in FIG. 3 are denoted by like or corresponding reference characters in FIG. 1.

The comparator 12 compares a sawtooth voltage $E_3$ supplied to a positive terminal thereof with an output voltage $E_2$ supplied from the tablet 10 to a negative terminal thereof, and issues a voltage $E_4$ which is of high level when $E_3 \geq E_2$ and of low level when $E_3 < E_2$. The voltage $E_4$ is supplied to the diode 13. A constant reference voltage $E_{S2}$ is supplied from the input terminal to the diode 14.

The output voltage $E_4$ of high level from the comparator 12 is higher than the constant reference voltages $E_{S1}$, $E_{S2}$, and when at low level is lower than the constant reference voltages $E_{S2}$, $E_{S3}$. Therefore, when the output voltage $E_4$ is of high level, it is available from the output terminal of the diode 13, and the diode 14 is cut off with no reference voltage $E_{S2}$ appearing at the output terminal of the diode 14. Conversely, when the output voltage $E_4$ is of low level, the reference voltage $E_{S2}$ becomes available from the output terminal of the diode 14, and the diode 13 is cut off with no output voltage $E_4$ appearing at the output terminal of the diode 13.

Therefore, the output voltage $E_1$ from the interface circuit 11 is equal to the output voltage $E_4$ when the latter is of high level, and to the reference voltage $E_{S2}$ when the output voltage $E_4$ is of low level. The output voltage $E_1$ from the interface circuit 11 is then applied from the input terminal 4 to the comparator 8 in the analog input unit 2. The output voltage $E_1$ falls to zero (V) while the on-off switch 6 is turned on or closed which is cyclically opened and closed. The reference voltage $E_{S2}$ is lower than the reference voltage $E_{S1}$, and hence a voltage $E_0$ issued from the comparator 8 becomes high in level during periods of the voltage $E_1$ which correspond to the high-level periods of the output voltage $E_4$ from the comparator 12.

The voltage $E_1$ fed to the input terminal 4 is also supplied to a negative terminal of the comparator 17 with its positive terminal supplied with the reference voltage $E_{S3}$ for comparison with the voltage $E_1$. The reference voltage $E_{S3}$ is lower than the reference voltage $E_{S2}$ from the input terminal 15, but not zero (V). As a consequence, when the voltage $E_1$ is zero (V), the comparator 17 generates a voltage $E_5$ of high level which serves as a reset signal to reset the sawtooth generator 18. When no no such reset signal is supplied, the sawtooth generator 18 is not reset and the output voltage $E_3$ rises at a substantially constant gradient. More specifically, the sawtooth generator 18 is reset each time the on-off switch 6 is closed, and the output voltage $E_3$ from the sawtooth generator 18 becomes a sawtooth voltage which falls to zero (V) during each reset period. The sawtooth voltage $E_3$ is thus in synchronism with the operation of the on-off switch 6.

Examples of the voltages are set forth below:

$E_{S1} = 2$ (V), $E_{S2} = 1.8$ (V), $E_{S3} = 1.3$ (V),

Minimum value of $E_3 = $ zero (V),

Maximum value of $E_3 \geq E_2$,

High level of $E_4 > 2$ (V), Low level of $E_4 = $ zero (V).

Figure 4:
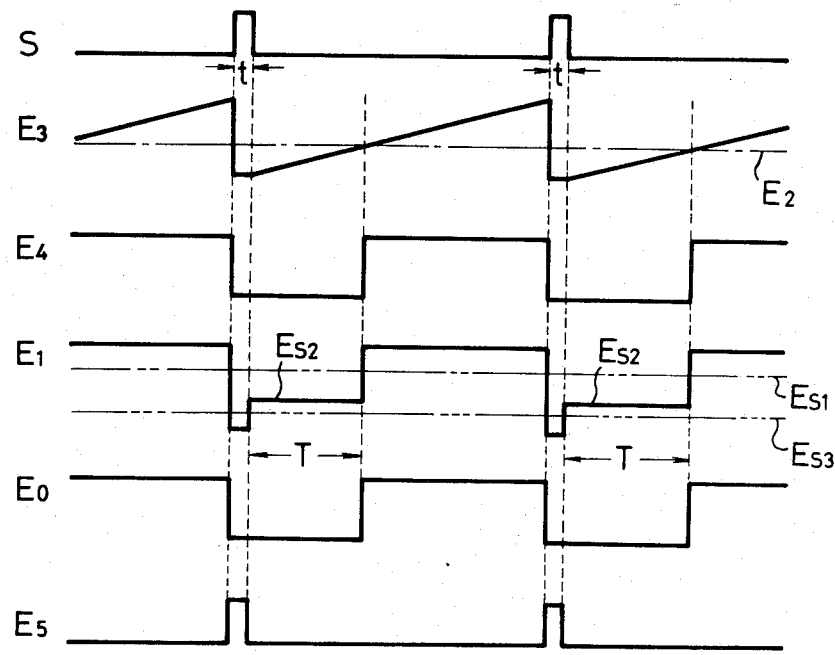
FIG. 4 is a diagram showing the waveforms of voltages in the interface circuit of FIG. 3.

FIG. 4 shows the waveforms of the voltages applied or produced in the circuit arrangement illustrated in FIG. 3. Identical voltages are denoted by identical reference characters in FIGS. 3 and 4.

With the voltages specified as above, operation of the circuit arrangement of FIG. 3 will be described with reference to FIG. 4.

When the on-off switch 6 in the analog input unit 2 is closed, the voltage $E_1$ falls to zero (V), and the output voltage $E_0$ from the comparator 8 goes low. Since the reference voltage $E_{S3}$ from the input terminal 16 is 1.3 (V), the comparator 17 generates the reset signal $E_5$, whereupon the output voltage $E_3$ from the sawtooth generator 18 falls to zero (V) and is supplied to the positive terminal of the comparator 12.

When the output voltage $E_2$ from the tablet 10 is not zero (V), $E_3 < E_2$, and the output voltage $E_4$ from the comparator 12 is of low level, that is, zero (V).

When the on-off switch 6 is opened upon elapse of the time period t, the voltage $E_1$ becomes 1.8 (V) which is equal to the reference voltage $E_{S2}$ from the input terminal 15. Since $E_{S3} < 1.8$ (V), the comparator 17 generates no reset signal. Accordingly, the sawtooth generator 18 is released of the reset condition, and the output voltage $E_3$ becomes progressively increased from zero (V).

The output voltage $E_4$ from the comparator 12 remains zero (V), and the voltage $E_1$ remains 1.8 (V) equal to the reference voltage $E_{S2}$ as long as $E_3 < E_2$. During this period, the output voltage $E_0$ from the comparator 8 in the analog input unit 2 is of low level.

When the output voltage $E_3$ from the sawtooth generator 18 is raised to the point where $E_3 = E_2$, the output voltage $E_4$ from the comparator 12 rises to high level. Since the output voltage $E_3$ continues to go up until the on-off switch 6 is closed, the output voltage $E_4$ from the comparator 12 remains high in level during this interval of time. The voltage $E_1$ is of a value higher than 2 (V) which is equal to the value of the output voltage $E_4$. The output voltage $E_0$ from the comparator 8 becomes high in level accordingly.

When the on-off switch 6 is closed, the voltage $E_1$ falls to zero (V) again, and the output voltage $E_0$ from the comparator 8 goes low. The comparator 17 issues the reset signal $E_5$ again to repeat the foregoing cycle of operation.

With the foregoing circuit arrangement operating as above, the output voltage $E_2$ from the tablet 10 varies with the resistance thereof during the period of time beginning when the sawtooth generator 18 starts being reset and ending when $E_3 = E_2$, that is, the low-level period of the output voltage $E_4$ from the comparator 12. Because the voltage $E_3$ to be compared with the output voltage $E_2$ from the tablet 10 increases substantially rectilinearly, the output voltage $E_4$ from the comparator 12 is substantially proportional to the resistance of the tablet 10 during a low-level period T from which is excluded the period t in which the on-off switch 6 is closed. By equalizing the range in which the output voltage $E_2$ is variable to the range in which the output voltage $E_3$ is variable, the low-level period of the output voltage $E_4$ from the comparator 12 can be equalized to the period of operation of the on-off switch 6 when the resistance of the tablet 10 is varied to a maximum extent. Therefore, the output voltage $E_1$ from the interface circuit 11 can represent, on an enlarged scale, a narrow range of variation of the resistance of the tablet 10.

The voltage $E_1$ is supplied to the comparator 8 which produces the output voltage $E_0$ that goes high only when the high-level periods of the voltage $E_1$. The operation of the analog input unit 2 has no effect on the content of information contained in the voltage $E_1$. The capacitor 5 can be charged and discharged immediately without affecting the operation of the analog input unit 2.

While the operation of the interface circuit has been described with reference to the specific numerical values, it should be understood that the present invention should not be interpreted as being limited to the specified values. The voltages may be of any other desired values, may be subjected to variations or fluctuations without affecting the operation, and may have widened allowable ranges, provided the following condition can be met:

High level of the voltage $E_4$ > the reference voltage $E_{S1}$ > the reference voltage $E_{S2}$ > the reference voltage $E_{S3}$ > zero (V)

The output voltage from the tablet 10 is actually composed of two output voltages generated in X and Y directions. In such an actual arrangement, the output voltage in the Y direction may be supplied to the comparator 12 shown in FIG. 3, the output voltage in the Y direction may be compared by another comparator with the output voltage $E_3$ from the sawtooth generator 18, and an output voltage from the comparator may be supplied to the analog input unit 2. The microcomputer may have analog input units for receiving signals indicative of resistances in X and Y directions of the multidirectionally operable variable resistor, and voltages produced when the tablet is operated in X and Y directions may be applied to the analog input units, respectively.

With a so-called two-phase tablet composed of one resistor layer and one conductive layer, the power supply is switched between the resistor and conductive layers when producing output voltages in X and Y directions. Such switching may be effected on the basis of the reset signal $E_5$ issued from the comparator 17 shown in FIG. 3. A signal for performing such switching can easily be produced by a suitable means such as a D flip-flop.

As described above, an interface circuit of the present invention can connect a tablet having a resistance range which is widely different from that of a multi-directionally operable variable resistor to an analog input unit which is designed for connection to such a multi-directionally operable variable resistor. The interface circuit also can generate a signal indicative accurately of any tablet resistance and supply the signal to the analog input unit. The interface circuit is simple in construction, has a better capability than that of the prior analog-to-digital converter arrangement, and is less costly to manufacture.

Although a certain preferred embodiment has been shown and described, it should be understood that many changes and modifications may be made therein without departing from the scope of the appended claims.

What is claimed is:

1. An interface circuit for connecting a low-resistance analog voltage output device, such as a tablet, to an analog input circuit, such as for a computer, of the type having an input terminal connected to a capacitor, a comparator for comparing an input signal to a first reference voltage, and means for discharging the capacitor at predetermined time intervals, comprising:

a sawtooth generator for providing a sawtooth voltage;

an interface comparator having an input terminal for receiving said analog voltage of said low-resistance analog voltage output device and comparing it to said sawtooth voltage, and for providing an output signal to an output terminal of low level when said analog voltage is lower than said sawtooth voltage and of high level when said analog voltage is higher than said sawtooth voltage, said output terminal of said interface comparator being connected to said input terminal of said analog input circuit; and reset means for detecting said discharging of said capacitor of said analog input circuit and resetting said sawtooth generator at said predetermined time intervals.

2. An interface circuit according to claim 1, wherein said reset means includes means for comparing a voltage at said input terminal of said analog input circuit to a third reference voltage and providing a reset signal to said sawtooth generator when said voltage at said input terminal of said analog input circuit drops below said third reference voltage due to said discharging of said capacitor.

3. An interface circuit according to claim 2, further comprising means connected to said output terminal of said interface comparator for providing a second reference voltage as a low level output of said interface circuit when said output signal of said interface comparator is at a low level, and wherein said high level of said output signal of said interface comparator is greater than said first reference voltage of said analog input circuit, which is greater than said second reference voltage of said low level output, which is greater than said third reference voltage of said reset means, which is greater than zero.

* * * * *